United States Patent [19]

Moslehi et al.

[11] Patent Number: 4,996,077
[45] Date of Patent: Feb. 26, 1991

[54] DISTRIBUTED ECR REMOTE PLASMA PROCESSING AND APPARATUS

[75] Inventors: Mehrdad M. Moslehi; Steve S. Huang, both of Dallas, Tex.

[73] Assignee: Texas Instruments Incorporated, Dallas, Tex.

[21] Appl. No.: 255,208

[22] Filed: Oct. 7, 1988

[51] Int. Cl.$^5$ .............................................. B05D 3/06
[52] U.S. Cl. .................................... 427/38; 118/719; 118/722; 156/643; 427/47; 427/45.1; 427/53.1; 427/54.1; 427/55
[58] Field of Search ................. 427/38, 47, 45.1, 54.1, 427/55; 156/643; 118/719, 722

[56] References Cited

PUBLICATIONS

Keizo et al., "The Roles of Ions and Neutral Active Species in Microwave Plasma Etching", J. Electrochem. Soc.: Solid-State Science and Technology, Jun. 1979, pp. 1024-1028.
Matsuo et al., "Low Temperature Chemical Vapor Deposition Method Utilizing an Electron Cyclotron Resonance Plasma", Japanese Journal of Applied Physics, vol. 22, No. 4, Apr. 1983, pp. L210-L212.
Burke et al., "Microwave Multipolar Plasma for Etching and Deposition", Solid State Technology, Feb. 1988, pp. 67-71.
Ono et al., "Reactive Ion Stream Etching Utilizing Electron Cyclotron Resonance Plasma", J. Vac. Sci. Technol. B, vol. 4, No. 3, May/Jun. 1986, pp. 696-700.
Hale et al., "ibex-9000 ECR" Microscience, advertisement sent Sep. 29, 1987.
Cooke et al., "Multipolar ECR: Opening a New Range of Low-Damage Etch Processes", Semicon West Proceeding, 1988, pp. 289-296.
Hirao et al., "Properties of Silicon Oxynitride Films Prepared by ECR Plasma CVD Method", Japanese Journal of Applied Physics, vol. 27, No. 1, Jan. 1988, pp. L21-L23.
Alcatel, "RCE-160, Low Pressure High Density Plasma Processing with the Microwave DECR Reactor", 7.91.156.DVM-SDG. Printed in France 05/88. TechnicMedia pp.?
Alcatel, "Alcatel Technology: The Ultimate"7.91.153 DVM-SDG. Printed in France 03/88. TechnicMedia, pp. ?
Sumitomo Metals, "Bias ECR Plasma CVD", SME--TR-COO3, 1986, 2, pp. 1-13.
Sumitomo Metals "ECR Plasma Etching" SME-TR--E002, pp. 1-16.
Advertisement "ECR Plasma CVD System" Nakamura et al., ECR Plasma Deposition Under a Controlled Magnetic Field., Abstract Mp. 303, pp. 439-440.

Primary Examiner—Bernard Pianalto
Attorney, Agent, or Firm—B. Peter Barndt; James T. Comfort; Melvin Sharp

[57] ABSTRACT

A distributed electron cyclotron resonance remote plasma processing apparatus and method which includes generating electron cyclotron resonance activated species in plasma formation regions distributed peripherally around, remote from the wafer processing chamber and in fluid communication with the main transfer chamber; containing the activated species using a microwave gas discharge and a magnetic field in the plasma formation regions; introducing the plasma streams to the main transfer chamber; creating a magnetic mirror in the main transfer chamber using a magnetic field; and introducing the species to the process chamber and to a face of the workpiece. Such an apparatus could use multiple energy/excitation sources.

65 Claims, 13 Drawing Sheets

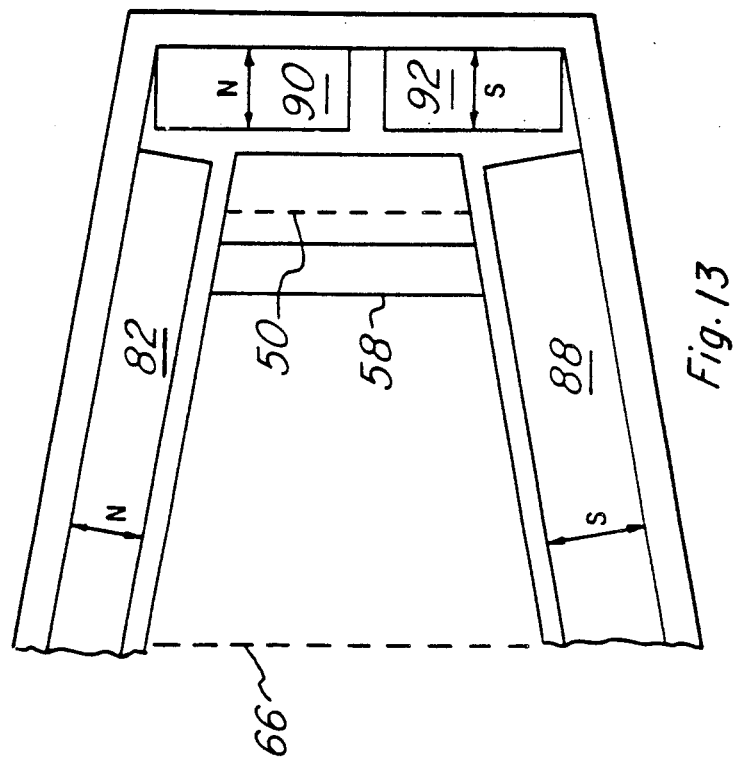
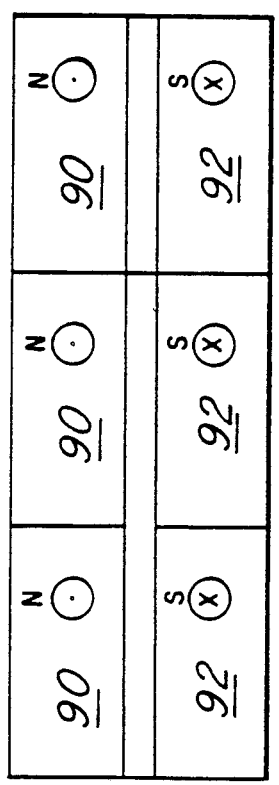
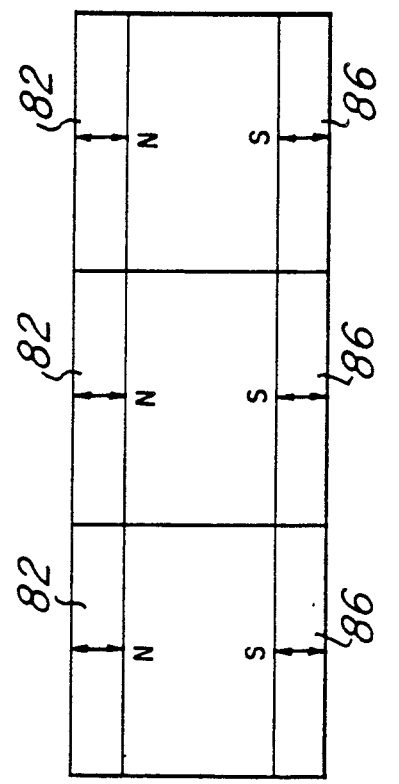

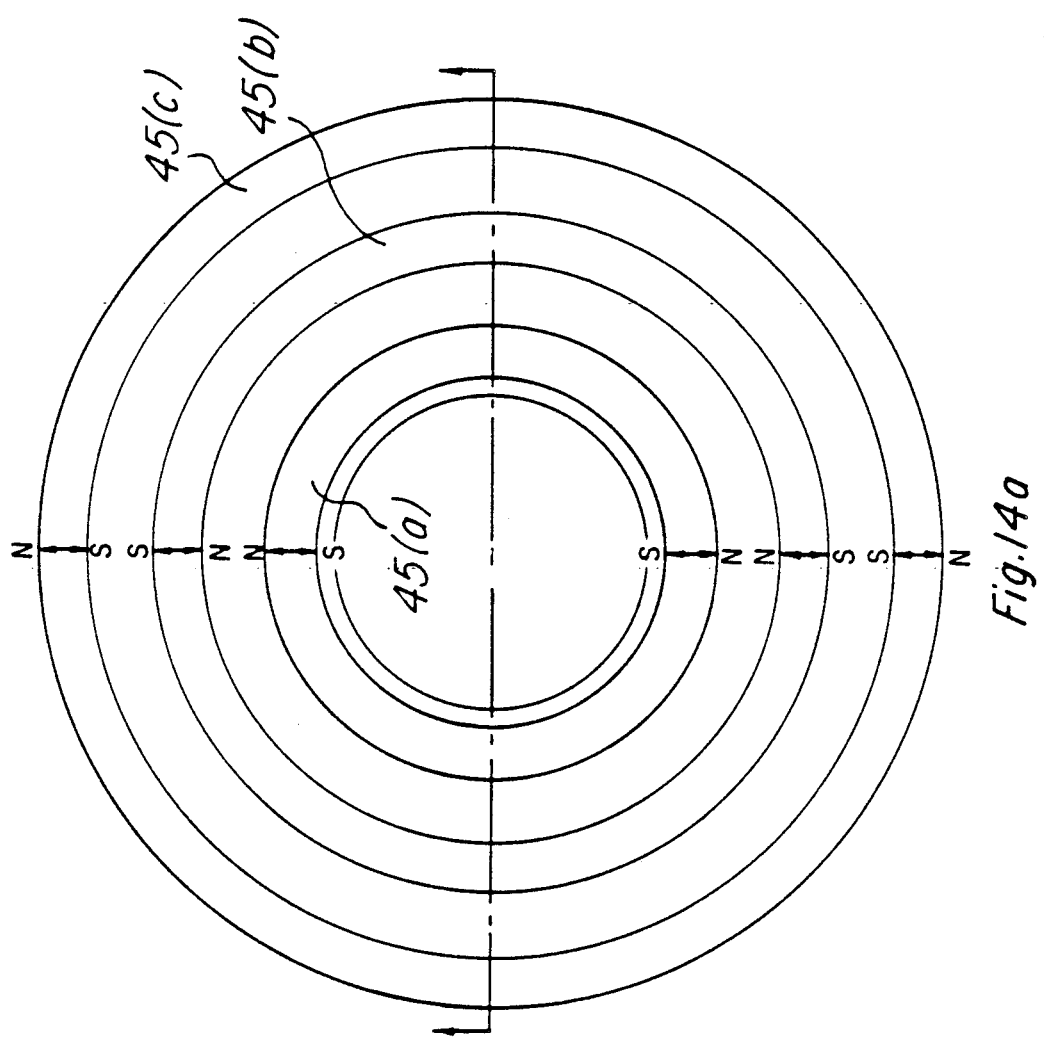

DISTRIBUTED ECR REMOTE PLASMA PROCESSING AND APPARATUS

BACKGROUND OF THE INVENTION

1. Field of the Invention

The present invention relates to a device and a method for processing of semiconductor wafers and fabrication of microelectronic devices.

2. Description of the Relevant Art

Advanced semiconductor VLSI technologies employ plasma processing for a number of important steps in the device fabrication sequence. The use of plasma processing results in a lower processing temperature and a higher deposition rate for growth and deposition of thin layers of insulators, semiconductors, or metals. Moreover, reactive ion etching processes in low-pressure plasmas are essential for anisotropic patterning of the submicron features in VLSI device structures.

Conventional plasma processing techniques, however, suffer from a number of limitations. Low-pressure reactive ion etching systems with RF (usually 13.56 MHz) discharge offer relatively low gas ionization efficiencies and can cause damage to the devices due to the large substrate floating potentials and excessive ion energies and plasma deposition processes using conventional discharge methods can also suffer from similar problems. A major disadvantage of the conventional RF discharge techniques is that the average ion energy cannot be controlled or adjusted independently and any adjustment of the ion energy results in a change in the plasma density and, as a result, the process kinetics.

Generation of plasmas by electrodeless microwave (2.45 GHZ) discharge is a viable alternative to the conventional RF discharge methods. The use of microwave power instead of lower frequency RF power enhances the gas ionization efficiency and reduces the ion bombardment-induced damage to the wafer due to the lower iow acceleration potentials. The coupling of microwave power to the discharge medium can be made very efficient if a suitable static magnetic field is established in the discharge medium. Under the so-called electron cyclotron resonance (ECR) condition, the electrons in the plasma experience a cyclotron (spiral) motion around the static magnetic flux lines while gaining energy from the alternating microwave eletric field. In a uniform magnetic field, the cross section of the path traversed by the electrons is a circle. The frequency of the cyclotron rotation ($f_c$) is directly proportional to the magnetic flux density (B) and inversely proportional to the electron mass ($m_e$), as shown below:

$$f_c = \frac{qB}{2\pi m_e}$$

where q is the electronic charge. Based on this equation, the frequency of cyclotron rotation is calculated to be $$f_c = \frac{2.80}{10^6 B}$$

in cycles per second where B is the static magnetic flux density in Gauss. Under ECR condition the electron cyclotron rotation frequency becomes equal to the microwave frequency. For a microwave frequency of 2.45 GHz, the ECR condition requires a magnetic flux density of 875 G. It should be noted that the cyclotron frequency only depends on B and is independent of the electron velocity. The curvature radius of the electron spiral path is inversely proportional to the component of the magnetic flux density perpendicular to the electron velocity vector.

The average power transferred to each electron in a microwave field is maximized when the ECR condition is satisfied because the cyclotron motion and the microwave electric field oscillations stay in phase with each other. From an electrical point of view, the plasma impedance is highly reactive (inefficient power absorption) at high frequencies. In an ECR microwave plasma, an electron continuously absorbs energy from the microwave field until it experiences a collision with a neutral gas species. Higher gas pressures result in larger electron collision probabilities and less energetic electrons in an ECR plasma because of a more frequent disturbance of the electron free spiral motion. As a result, ECR plasma processing effects will be more pronounced when the electron-neutral collision frequency is made much less than the ECR or microwave frequency. This implies that ECR is particularly useful for lower pressure processing (few mTorr and below; $10^{-3}$–$10^{-5}$ Torr range) where conventional RF discharge is rather inefficient.

ECR plasma generation techniques are capable of producing efficient plasmas at low pressures with much higher densities (as much as several orders of magnitude) compared to the conventional RF discharge or non-ECR microwave plasma techniques. The ECR enhancement also extends the operating process pressure domain down to very low pressures in the high-vacuum regime. ECR plasma processing is applicable to a wide range of advanced semiconductor device fabrication processes (dry clean-up, deposition, etching) as well as sequential in-situ mutiprocessing.

Most of the existing ECR plasma system designs employ electromagnets in order to generate a static magnetic field inside the plasma formation chamber. FIG. 1 shows the general schematic of an ECR plasma processing system which employs two electromagnets around a microwave discharge cavity in order to establish a spatially varying magnetic flux density and generate and ECR plasma stream. The electromagnets create a graded magnetic field inside the microwave discharge cavity and the ECR field condition (875 G) is satisfied at some point inside the cavity. The plasma stream is extracted along a divergent magnetic field from the plasma chamber to the reaction chamber. The magnetic flux density decreases gradually from the plasma chamber towards the substrate holder.

This type of ECR plasma system design has a number of limitations which can be summarized as follows:

The process uniformity on the wafer is very sensitive to the plasma uniformity in the plasma chamber and the plasma cavity electromagnetic mode of operation (standing wave patterns). The plasma nonuniformity patterns can be easily projected onto the wafer because of the presence of longitudinal magnetic field lines.

The system design is not easily scalable for larger wafer diameters. Larger wafers dictate the use of larger plasma cavities and larger electromagnets which can result in a less uniform plasma and a more complicatd reactor design.

The diverging magnetic flux lines extend all the way to the wafer surface and result in a less uniform process even if perfect plasma uniformity is achieved in the plasma cavity. The process nonuniformity problems caused by the field divergence effects are particularly more critical in dry etching applications.

The large electromagnets require water cooling and a large amount of electrical power to sustain the magnetic field.

Precise ion energy control is difficult because the wafer experiences perpendicular magnetic field lines and the ions gain translational acceleration by moving along the high-to-low magnetic flux lines extending from the plasma chamber to the wafer. The field lines can also affect the plasma electrical potential.

In some existing ECR reactor designs the process uniformity is somewhat improved by using a third electromagnet under the wafer holder in order to produce a more uniform perpendicular magnetic field and reduce its divergence on the wafer. Moreover, the substrate holder may be coupled to an RF source (13.56 MHz) in order to control the wafer potential with respect to the plasma to enhance the incoming ion energies and to reduce the divergent magnetic field effects. Nonetheless, these designs do not remove the other limitations of this type of reactor design.

Besides the ECR reactor designs similar to the schematic shown in FIG. 1, a multipolar distributed ECR reactor has also been discussed in the literature. FIG. 2 shows the schematic of a multipolar ECR equipment design where the energetic electrons are confined to the magnetic cusps at the outer edge of the process chamber. In this system, plasma is produced near the chamber wall and diffuses towards the chamber center. The magnetic field lines at the center of the chamber are rather weak and parallel to the wafer surface. The multipolar field created by the permanent magnets creates the ECR condition and reduces plasma losses to the chamber walls by magnetic confinement of the plasma. The multipolar ECR design may have some advantages over the conventional ECR systems (and also some disadvantages). Some of its limitations are as follows:

The plasma formation chamber is the same as the process chamber. This restricts the system applications to the processes with one composite plasma medium. Any gas injected into the vacuum chamber will be subjected to microwave discharge and the system design does not allow selective plasma formation simultaneous with injection of non-plasma gases onto the wafer. Therefore, the system application will be mostly for etching processes.

The entire process chamber and the wafer are immersed in a microwave field. As a result, the plasma and process uniformity on the wafer may be affected by the microwave standing wave and power absorption patterns.

The total volume of the ECR plasma formation regions is a small fraction of the total process chamber volume. This may limit the plasma density on the wafer.

Accordingly it would be useful to be able to provide a distributed ECR device that has process uniformity, is scalable, has low power consumption, causes less substrate damage, has an independent non-plasma gas injection capability provides a remotely generated ECR plasma allows independent control over plasma density, and allows sequential in-situ multiprocessing.

SUMMARY OF THE INVENTION

The present invention overcomes the problems of existing ECR plasma techniques and provides improvements over existing broad beam, divergent-field ECR and multi polar ECR systems.

According to one embodiment of the present invention there is provided a distributed electron cyclotron resonance remote plasma processing apparatus, comprising: a processing chamber; a main transfer chamber in fluid communicatin with the processing chamber; a plurality of peripheral magnet bars surrounding the main tranfer chamber; a plurality of electron cyclotron resonance plasma formation regions peripherally distributed around the periphery of, remote from, and in fluid communication with the main transfer chamber; and a plurality of magnet bars substantially surrounding external surfaces of said plasma formation regions.

In another embodiment, there is a distributed electron cyclotron resonance remote plasma processing apparatus, comprising: a processing chamber; a main transfer chamber in fluid communication with the processing chamber; a plurality peripheal magnet bars surrounding the main transfer chamber; a toroidal plasma formation region of trapezoidal cross section around the periphery of, remote from, and in fluid communication with the main transfer chamber; a plurality of magnet bars substantially surrounding external surfaces of the plasma formation region; and a plurality of plasma generators peripherally distributed in the plasma formation region.

In yet another embodiment there is indicated a method for distributed electron cyclotron resonance remote plasma processing of a workpiece, comprising: generating electron cyclotron resonance activated species in plasma formation regions distributed peripherally, remote from and in fluid communication with a main transfer chamber; containing the activated species using a magnetic field in the plasma formation regions; introducing the activated species to the main transfer chamber; creating a magnetic mirror in the main transfer chamber using a magnetic field; and introducing the activated species to hte process chamber and to a face of the workpiece.

The present invention provides at least the following advantages, in addition to others mentioned in this application:

The module design comprises multiple distributed ECR plasma formation chambers connected to a main cylindrical transfer chamber.

The system design allows independent control over each of the multiple a plurality of ECR plasma formation chambers.

The process chamber and wafer are free of static magnetic field and microwave power. Microwave power is only fed to the ECR plasma formation chambers and does not leak into the main transfer chamber.

The main transfer chamber provides a full-scale view of the wafer front face through a sapphire window at one end. This important design feature provides capability for photon-assisted processing using incoherent deep UV lamps or excimer laser sources. The other port of the transfer chamber couples the wafer to the heating or cooling source, RF chuck, etc.

In contrast to the conventional ECR systems, the distributed, ECR remote plasma system design is easily scalable for larger wafer diameters without any degradation of process uniformity. There is no limitation in terms of the size of the wafer.

Both ECR plasma generation and confinement are achieved by ceramic permanent magnetic circuitry instead of electromagnets. Therefore, there is no need for electrical power and water cooling in the magnetic circuitry.

The system is capable of simultaneous generation of multiple ECR plasma streams of more than one gas (spatially resolved plasma streams) in the peripheral ECR plasma formation chambers, avoiding the possible complications of composite gas discharge media. The plasma streams of different gases are intermixed in the main transfer chamber only after their formation.

The ECR remote plasma streams are freely superimposed and mixed in the transfer chamber before arriving on the wafer surface and without any magnetic field effects. The center of the cylindrical transfer chamber is free of magnetic field lines and allows free diffusion and intermixing of the ionic species. Therefore, excellent process uniformity should be easily obtained.

BRIEF DESCRIPTION OF THE DRAWINGS

The present invention will be described with reference to the accompanying drawings, wherein:

FIGS. 12(a) an (b) show a horizontal cross section of a useful embodiment of one of the plasma formation regions of the distributed multipolar ECR processing module embodied in FIG. 11.

FIG. 13 shows a vertical cross section of a useful embodiment of one of the plasma formation regions of the distributed multipolar ECR processing module also embodied in FIG. 11.

In the various figures the same reference numerals are used to denote similar parts. Additionally, in the drawings, the sizes and dimensions of the various parts have been exaggerated or distorted for clarity of illustration and ease of description.

DETAILED DESCRIPTION OF THE PREFERRED EMBODIMENT OF THE INVENTION

Figure 1:
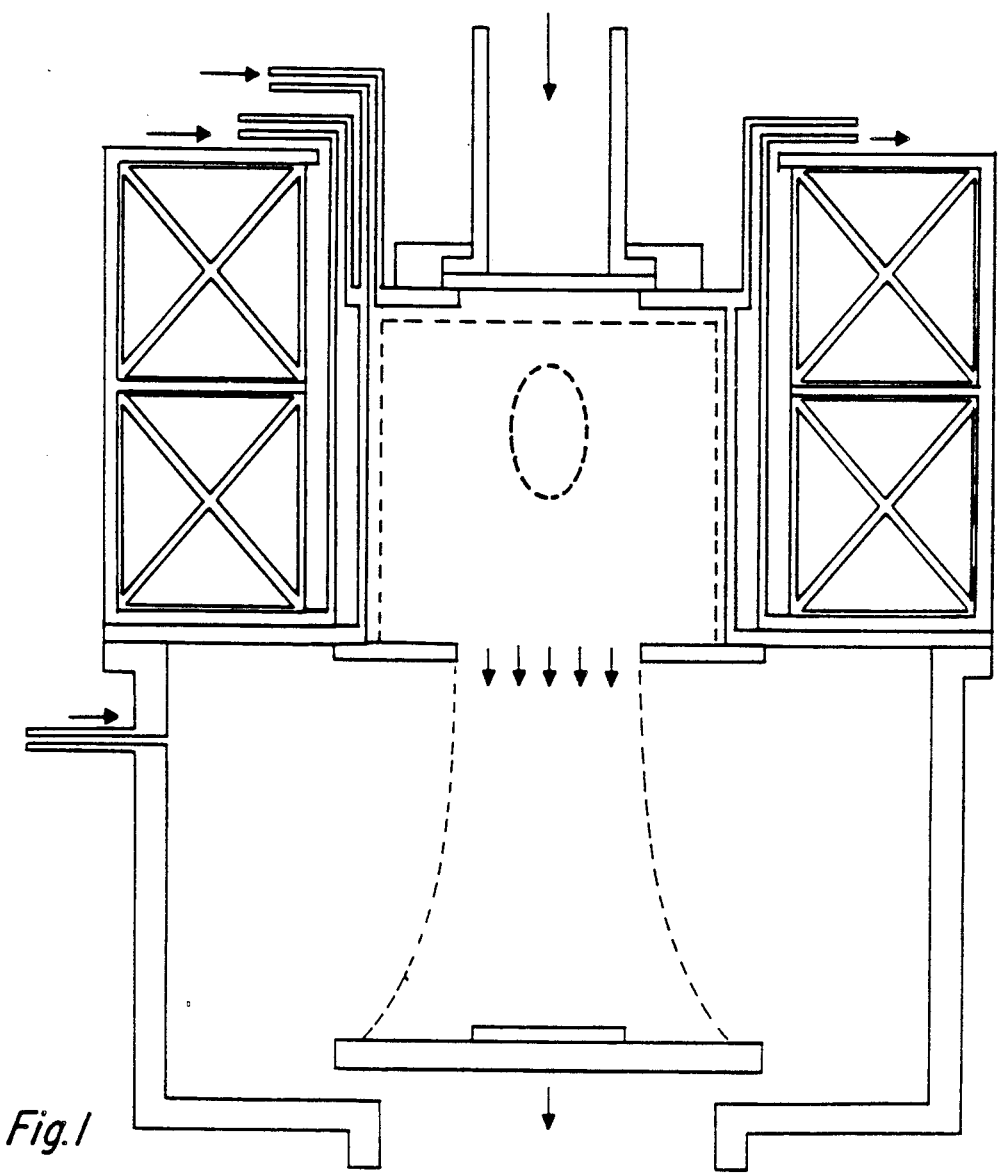
FIG. 1 shows a prior art ECR plasma system.
Figure 2A:
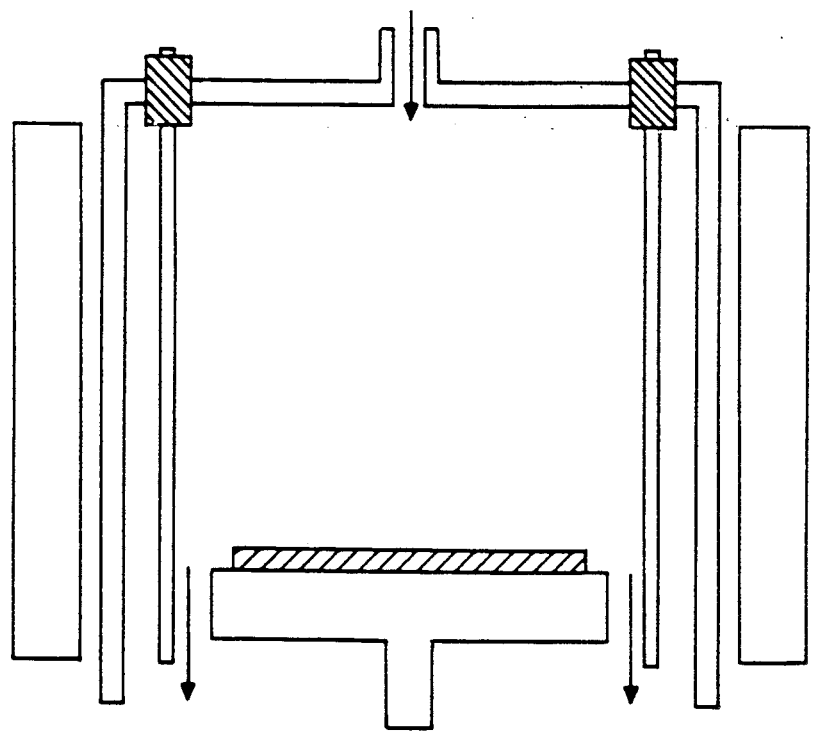
FIGS. 2(a) and (b) show a prior art multipolar ECR microwave plasma system.
Figure 2B:
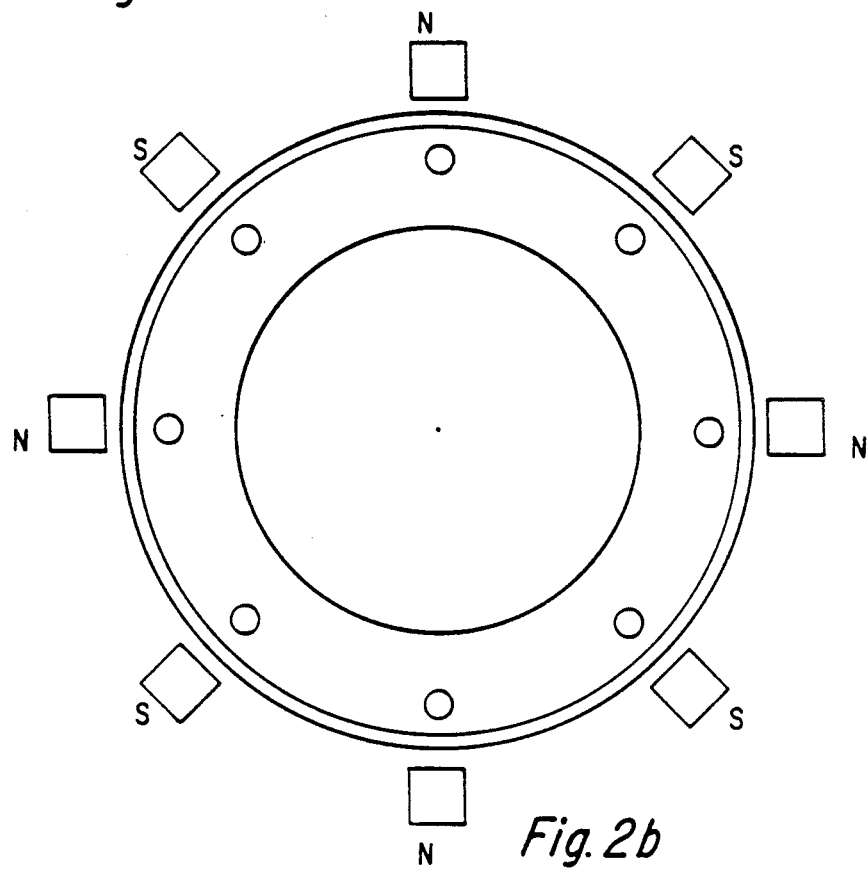
Figure 3:
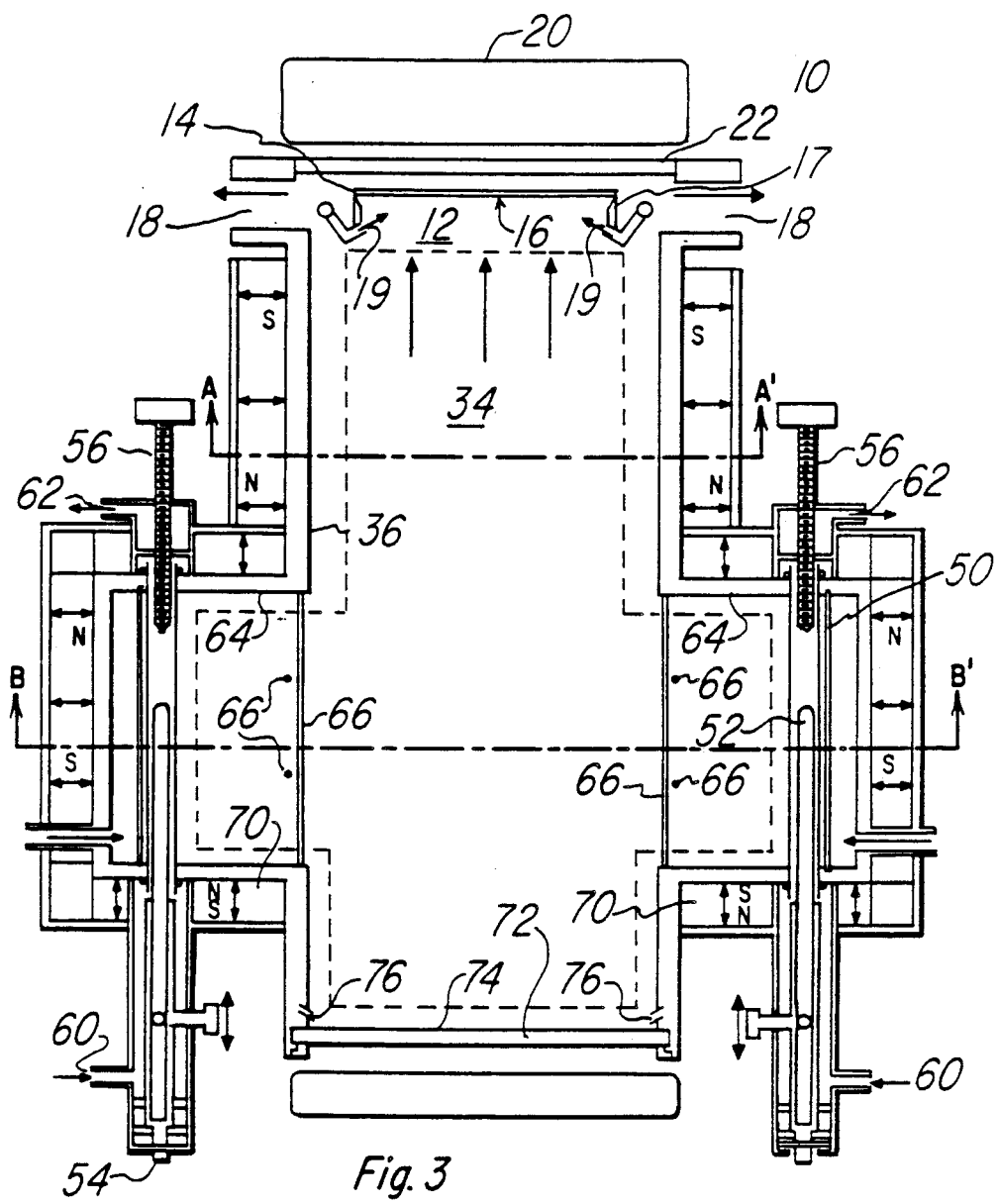
FIG. 3 shows a useful embodiment distributed multipolar ECR processing module.

FIG. 3 shows a useful embodiment of a distributed multipolar ECR processing module 10. Processing module 10 has a processing chamber 12 wherein a wafer 14 can be processed in a various ways, e.g. etching, deposition, or ashing etc. Processing module 10 can be formed from many materials (e.g. aluminum, stainless steel, etc.). In order to minimize contamination of the wafer 14, the inner walls 36 of processing module 10 are properly passivated and the permanent magnets are placed in such a way as to keep the reactants away from the inner walls 36. Processing chamber 12 is typically maintained at a vacuum.

Wafer 14 is supoported with a face to be processed 16 facing downward by wafer support 17. The wafer 14, however, can have its face to be processed 16 facing up, down or have a normal to its face parallel to the ground. Having wafer 14 face to be processed 16 facing downward or having its normal parallel to the ground reduces the potential for particulate contamination. A vacuum is drawn through a vacuum pumping ports 18. The placement of the vacuum pumping ports 18 adds to the process uniformity across the face to be processed 16. Nonplasma process gas injectors 19 are arranged around the periphery of wafer 14 to provide uniform distribution of non-plasma process gasses.

The processing temperature of wafer 14 can be established in various ways with minimal hardware modifications. In FIG. 3, wafer 14 is shown as being heated by a radiant heater 20 which radiatively coupled to wafer 14 through a window 22 which can be transparent to visible light, for example, quartz or sapphire. Radiant heater 20 can be one of several types currently known in the art, e.g. tungsten-halogen or an arc lamp. Wafer support 17 supports the wafer a small distance from window 22. Other energy sources can be coupled to the wafer 14 or the processing chamber 12 and will be described in detail below.

Processing module 10 also contains a plurality of ECR plasma formation regions 48. An ECR plasma is generated in each plasma generating region 48 and the position of these regions results in a reactive plasma which is distributed uniformly around the circumference of the processing chamber 12. Although the number of plasma generating regions 48 shown is 6, any number of regions could be used. The plasma products then flow diffusively passed a suppression grid 66 into main transfer chamber chamber 34. Suppression grid 66 merely suppresses the microwave power transfer into the main transfer chamber 34 but does not affect the flow. Main transfer chamber 34 reduces the ion loss during transfer reduces contamination due to reactant interaction with the walls of the main transfer chamber and allows mixing of all reactants in an embodiment which is free of electromagnetic or magnetic fields. Both the main transfer chamber 34 and the plurality of ECR plasma formation regions 48 will be described in greater detail below.

A process gas is supplied through gas injectors 50. Gas injectors 50 are plates with small holes made in them such that a uniform reactant gas flow rate exists at the exit of the gas injector 50. It is activated to a plasma state by applying a microwave energy through a plurality of antennae 52 which are downstream of gas injectors 50. The reactant gas supplied to each of the gas injectors can be individually controlled to allow the generation of several reactive plasmas with separate control of each.

Each of the plurality of antennae 52 described above is optimally spaced from its corresponding gas injectors 50 for the most efficient power transfer to the reactant gas each of the antennae 52 is supplied with microwave energy via a conductor 54, e.g. coaxial cable each is encapsulated in a sheath 58 made of a non-conductive material, e.g. sapphire and is movable axially inside sheath 58. Optimal power transfer of the microwave energy to the injected gas and chamber is achieved through the the adjustment of an adjustable tuning probe 56 and its respective microwave antenna 52 which is contained in sheath 58. The microwave antennae 52 are cooled by circulating gas through supply ports 60 and returns 62.

The bottom of the main transfer chamber 34 is terminated by a window 72 which allows radiative coupling of electromagnetic energy sources in the visible range (e.g., ultraviolet energy or excimer LASER). Each energy source can be controlled independently of the ECR plasma formation region 48 and operated either simultaneously or serially, in any order. When such an energy source is coupled to the wafer through window 72, an inert purge, (e.g. argon) is applied to the inner wall of the window 74 via purge ports 76. The window also allows various non-contact, real-time measurements of the wafer 14, (e.g., interferometric temperature measurement).

Figure 4:
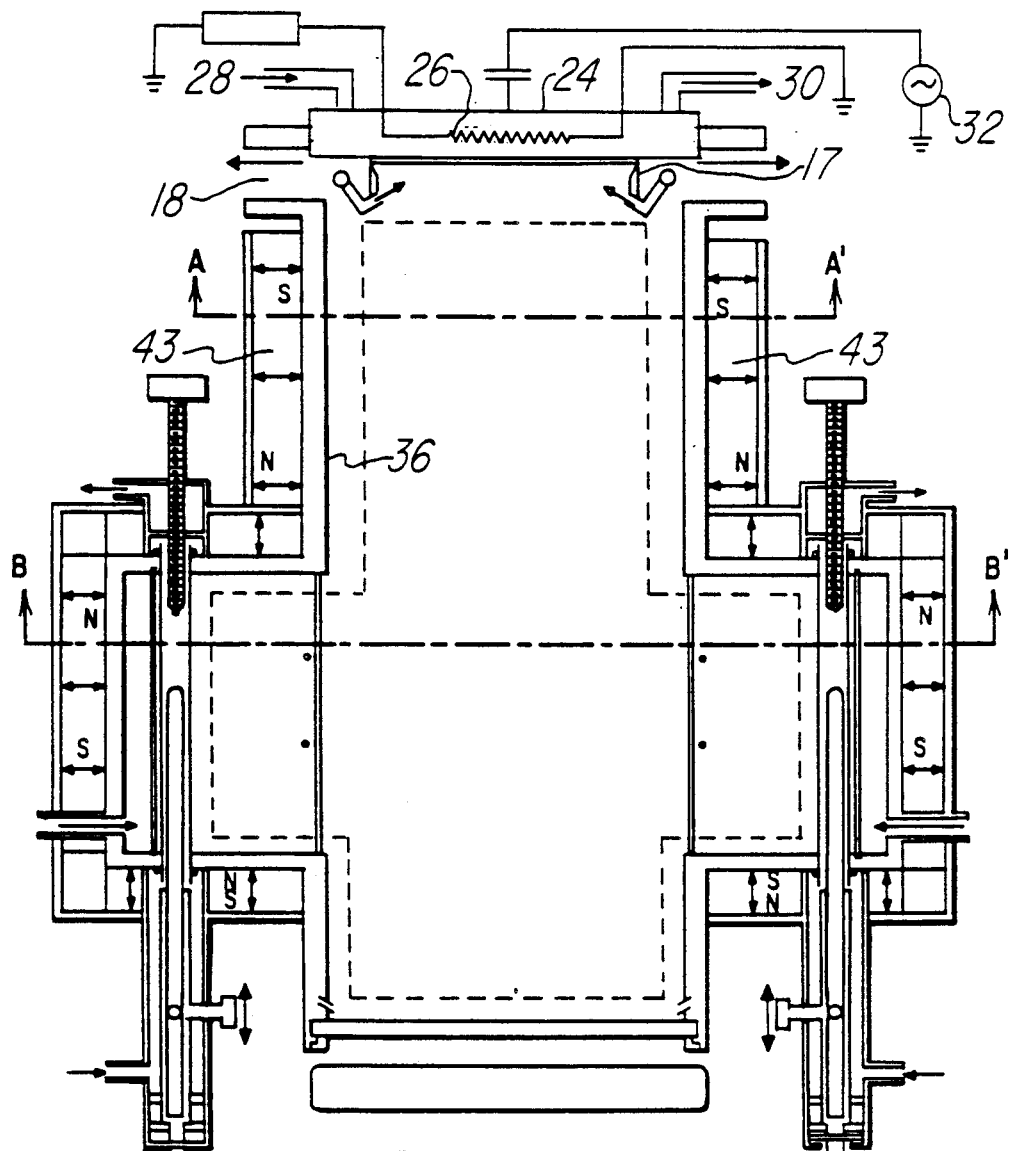
FIG. 4 shows another useful embodiment of the distributed multipolar ECR processing module.

FIG. 4 shows another useful embodiment of the multipolar ECR processing module 10. In this embodiment, wafer 14 is conductively heated or cooled by a substrate 24. Wafer 14 is supported in substantial contact with substrate 24 by wafer support 17. Substrate 24 and, consequently, wafer 14 can be heated by resistive heater 26 or cooled by cooling water supplied to the substrate through cooling water supplies 28 and return 30. This arrangement allows optimal temperature control process no matter what combination of multiple energy sources is coupled to the wafer 14, and process chamber 12. Therefore, the coupling of these other energy sources into the processing chamber 12 and to the wafer 14 allows a broader range of processes to be performed than the single power source processing module, for example, low temperature depositions, anisotropic etching. The listed energy sources have been shown as examples of how multiple energy sources can be coupled in to this processing module 10, however, other energy sources and combinations may provide significant processing flexibilty and efficiency.

Figure 5:
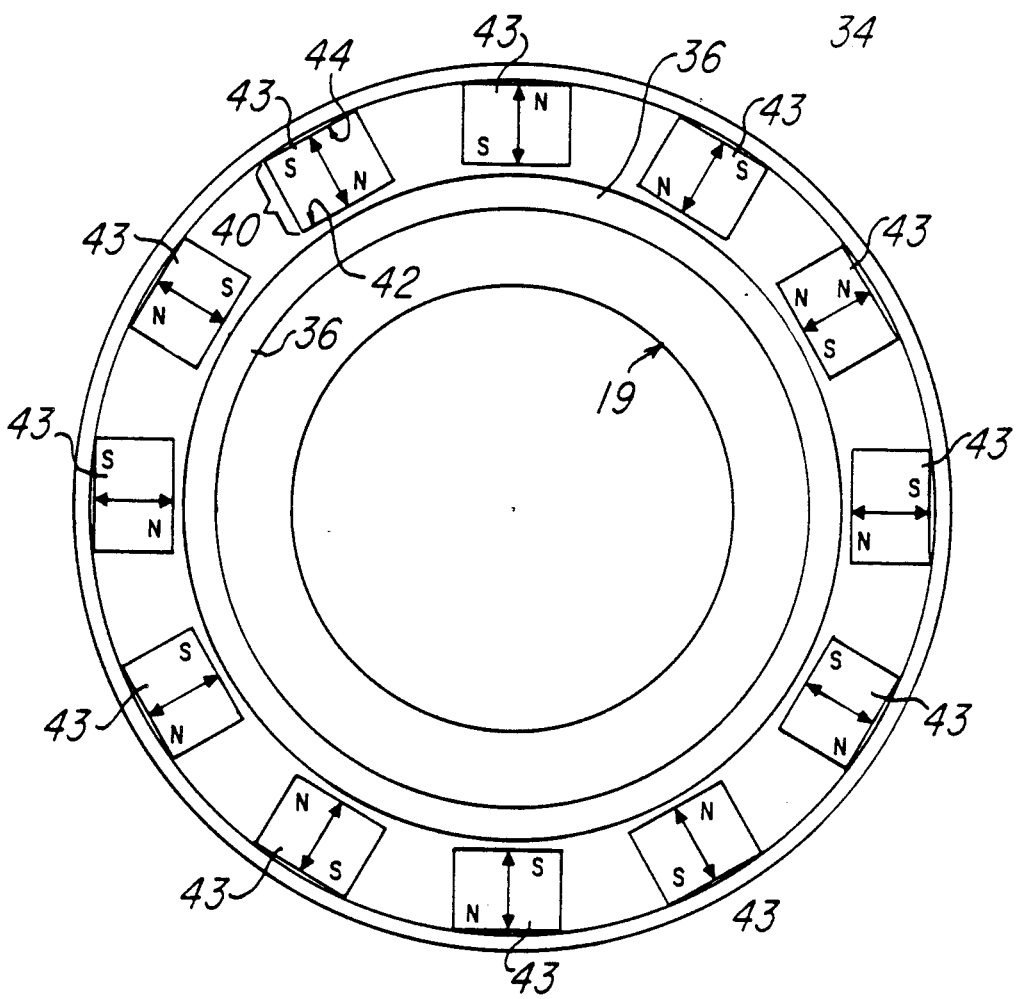
FIG. 5 shows a horizontal cross section of one embodiment of the main transfer chamber of FIGS. 3 and 4.

FIG. 5 shows a horizontal cross section of section A—A' of main transfer chamber 34 of either FIGS. 3 or 4. The projected image of the wafer 19 is shown concentric with the main transfer chamber 34 inner wall 36. Main transfer chamber 34 inner wall 36 is properly passivated (e.g. hard anodized aluminum) and has a radius somewhat greater, for example 50 mm, than the radius of the projected image of the wafer 19. Inner wall 36 can be cooled if necesssary using cooling water supplies (not shown). A plurality of individual main transfer permanent magnet bars 43 surround the inner wall 36. In this embodiment, magnet bars 43 are polarized along a radius of the main transfer chamber 34. This generates magnetic flux lines parallel to the face to be processed 16 of wafer 14. The inner surface 42 of adjacent magnet bars is oppositely polarized which results in magnetic cusp being formed which confines the plasma via magnetic mirror effects. The intensity of the magnetic flux and thus the penetration of the magnetic cusps into the main transfer chamber 34 can be adjusted by decreasing the thickness of the magnet bars or inserting iron plates (not shown) in the radial directions between magnet bars 38 and connecting them to external cylinder 46 which can be fabricated of any magnetic material, e.g. iron.

Figure 6:
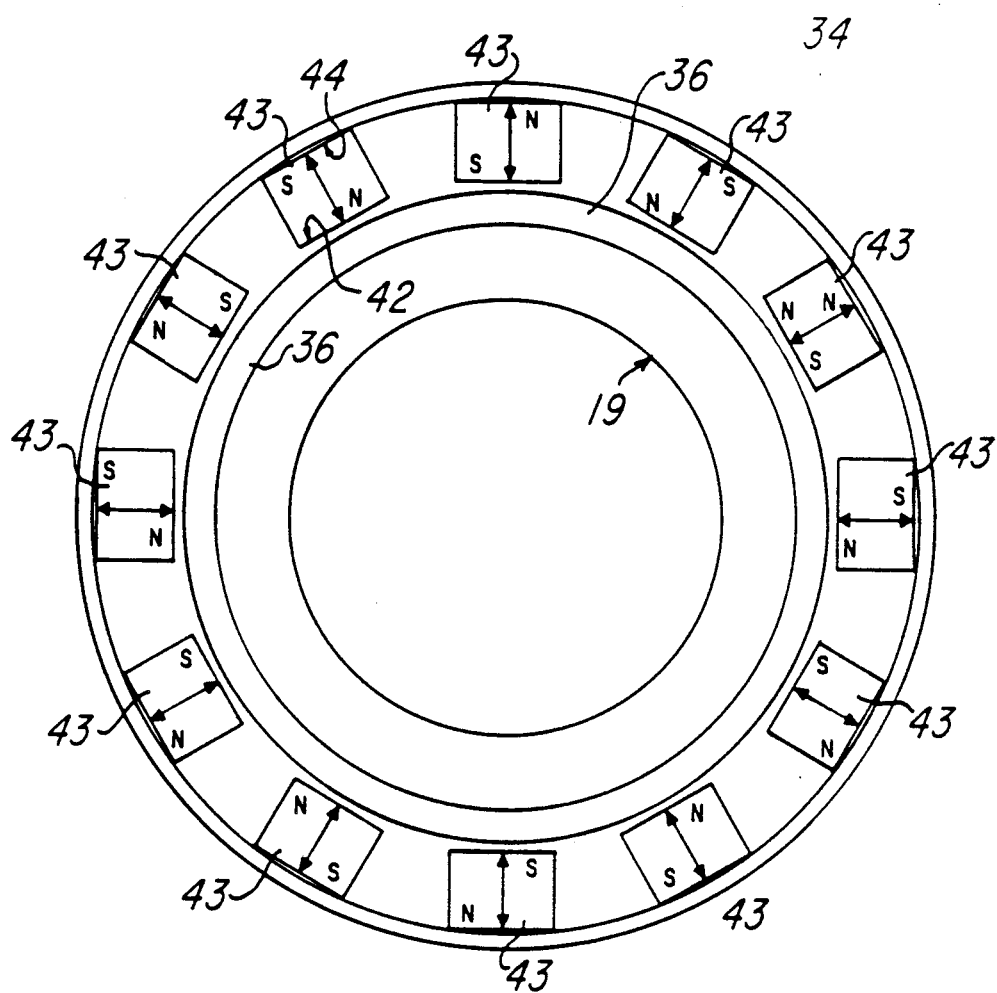
FIG. 6 shows a horizontal cross section of another embodiment of the main transfer chamber of FIGS. 3 and 4.

FIG. 6 shows a horizontal cross section A—A' another embodiment of the main transfer chamber of FIGS. 3 and 4. It is similar to the embodiment shown in FIG. 5, however, the magnets 43 are polarized perpendicular to the radius of the main transfer chamber 34. The lines of flux are still parallel to the face 16 of the wafer 14. This configuration generates a magnetic mirror which contains the plasma.

Figure 7:
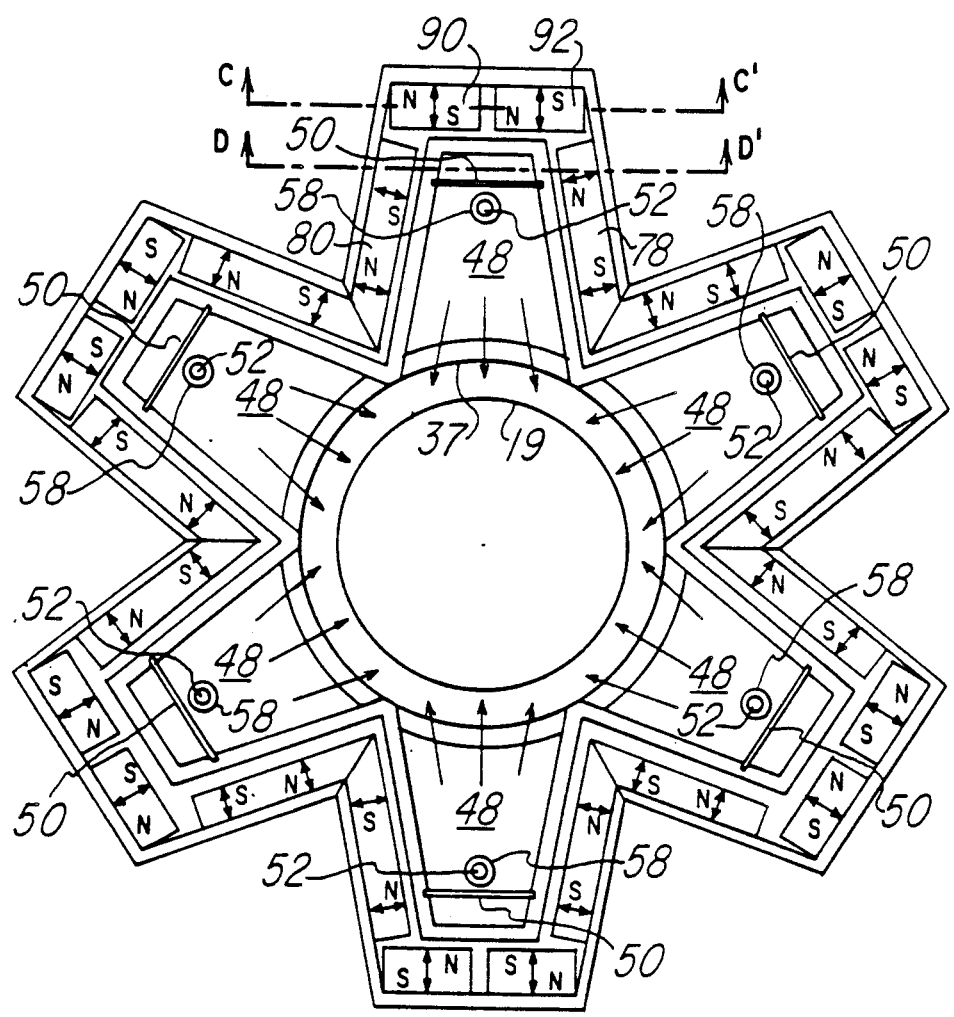
FIG. 7 shows a horizontal cross section of the plasma formation region chamber of a useful embodiment of the processing module of FIG. 3.

FIG. 7 shows a horizontal cross section of section B—B' of plasma formation region 48 of either FIGS. 3 or 4. The projected image of the main transfer chamber inner walls 37 and the projected image of the wafer 19 is shown concentric with the plasma formation regions 48. Each ECR plasma formation region 48 has a gas injector 50, a microwave antenna, and a sheath 58 which were described above and each 48 contains a first sidewall magnet 78 and a first backwall magnet 90. A second sidewall magnet 80 and a second backwall magnet 92. These magnets are usefully formed of a permanently magnetic material (e.g. a ceramic) covered by a nickel coated pure iron (soft magnetic material). Each ECR plasma formation chamber 48 has a trapezoidal shape as shown in FIG. 7. This trapezoidal shape, the magnet arrangement and the gradient in the thickness of the magnets results in the existence of a graded magnetic (i.e., a much higher magnetic field at the end wall) field. Consequently an ECR region in only one portion of the ECR plasma formation region 48 (for example, as is well known, where a 2.450 GHz energy signal is applied ECR will occur where the magnetic flux is 875 Gauss).

Figure 8A:
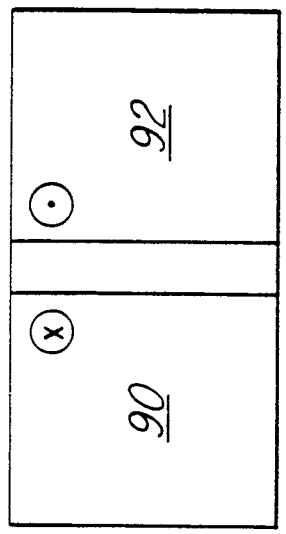
FIGS. 8(a) and (b) show a vertical cross section of a useful embodiment of one of the plasma formation regions of the distributed multipolar ECR processing module.

FIG. 8(a) shows a cross section of section C—C' i.e. the backwall of one of the plasma formation regions 48 of FIG. 7. As mentioned above each ECR plasma formation region has a number of permanent magnets around is periphery. The first backwall magnet 90 and the second backwall magnet 92 are polarized along the radius of the main tranfer chamber 34 and have opposite polarities.

Figure 8B:
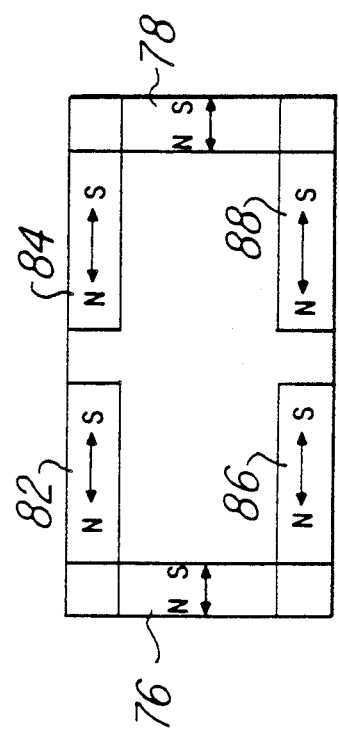

FIG. 8(b) shows a cross section of section D—D' of the plasma formation region 48 of FIG. 7. First top magnet 82, first side magnet 76, first bottom magnet 86 have which are themselves all perpendicular to the radius of the main transfer chamber and all are in the same direciton, second side magnet 78, second top magnet 84, and second bottom magnet 88 have parallel polarity axis. This creates magnetic cusps which contain the plasma on the top, bottom and at the end of the plasma formation region 48.

Figure 9:
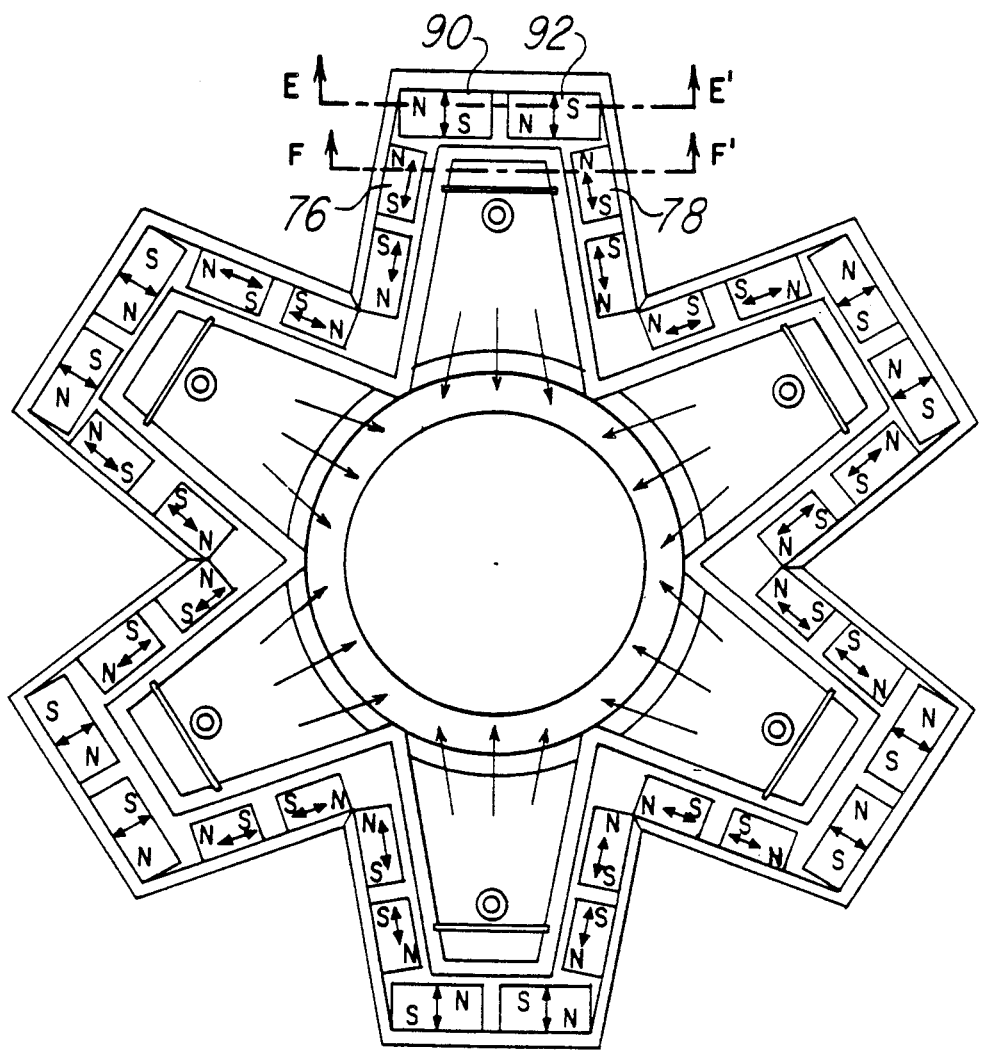
FIG. 9 shows a horizontal cross section of the plasma formation region chamber of another useful embodiment of the processing module of FIG. 3.

FIG. 9 shows horizontal cross section A—A' of the plasma formation region 48 chamber of another useful embodiment of the processing module 10 of FIGS. 3 and 4, i.e., cross section of section A—A'. This embodiment is similar to that shown in FIG. 7, except that it shows the polarity axis of each of the magnets generally parallel to the radius of the plasma formation regions 48.

Figure 10A:
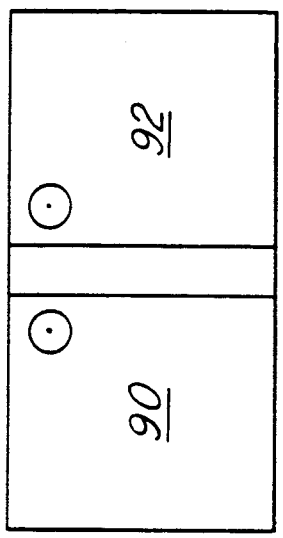
FIGS. 10(a) and (b) show a vertical cross section of a useful embodiment of one of the plasma formation regions of the distributed multipolar ECR processing module of FIG. 9.
Figure 10B:
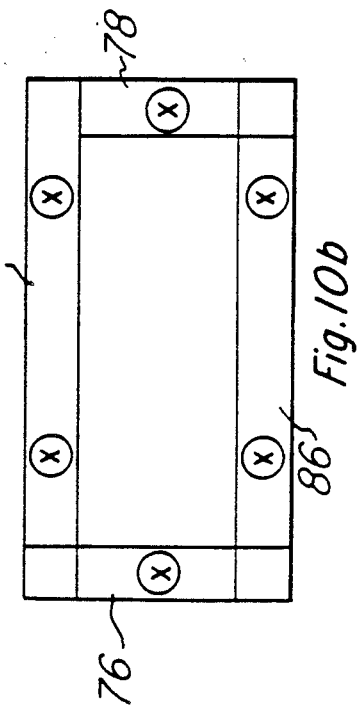

FIGS. 10(a) and (b) show vertical cross section E—E' and F—F' of a useful embodiment of one of the plasma formation regions of the distributed multipolar ECR processing module of FIG. 9. It is analogous to the configuration shown in FIGS. 8(a) and (b) and performs the same function.

Figure 11:
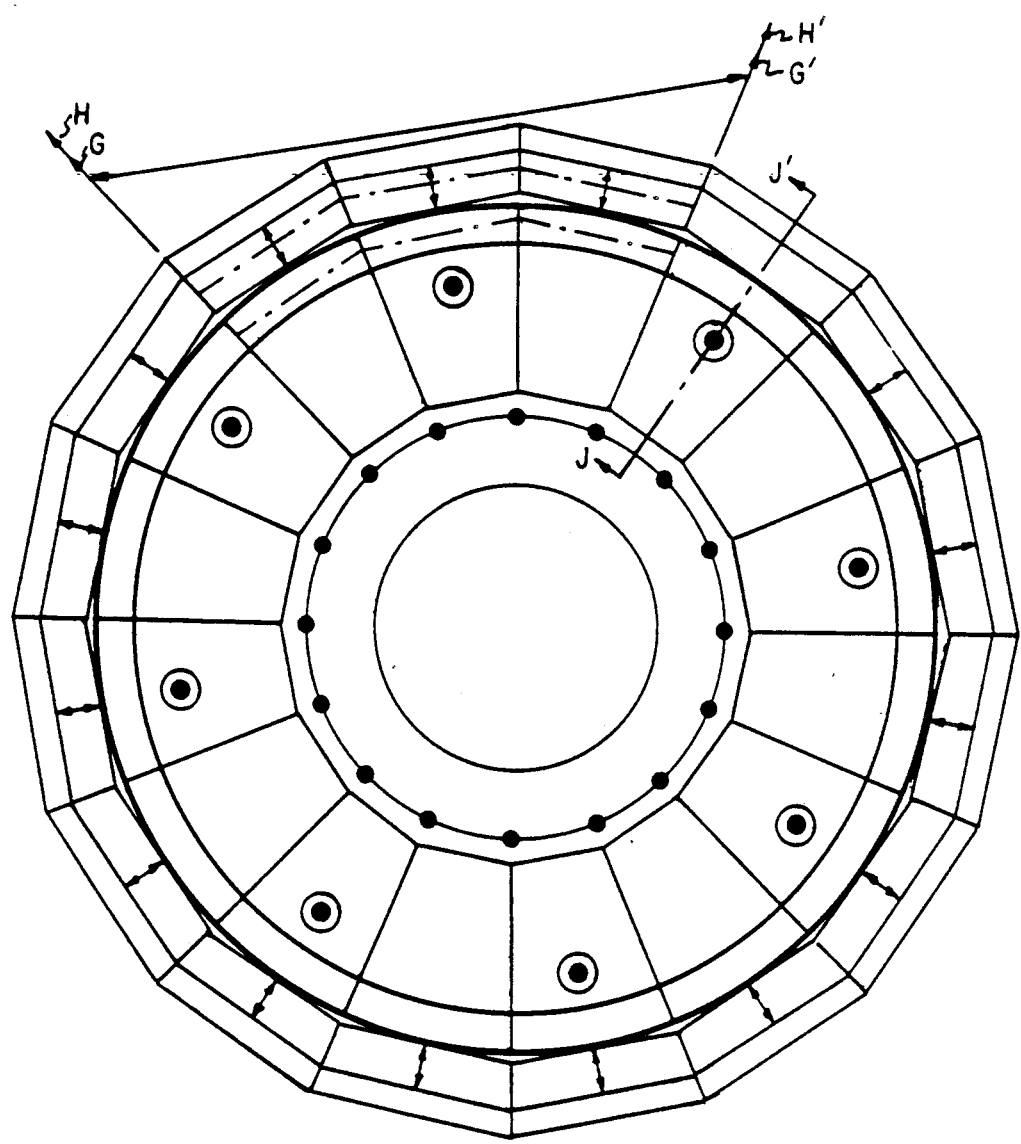
FIGS. 11 shows a cross section of another useful embodiment of one of the plasma formation regions of the distributed multipolar ECR processing module.

FIGS. 11 shows horizontal cross section B—B' of another useful embodiment of one of the plasma formation regions 48 of the distributed multipolar ECR processing module 10 as shown in FIGS. 3 and 4. It is analogous to the embodiments 7 and 9 and differs in that the plasma formation regions 48 are no longer partitioned. A minimal array of antennae 52 and gas injectors 50 are arranged, as shown in FIG. 11, to obtain the best microwave power matching. A suppression grid 66, as shown in FIG. 11, can be used to suppreess the microwave power transmission from the plasma formation region 48 to the main transfer chamber 34.

FIGS. 12(a) and (b) show vertical cross sections G—G' and H—H' of one of the plasma formation regions of the distributed multipolar ECR processing module embodied in FIG. 11. In FIG. 12(a) magnets 90 and 92 are polarized along an axis parallel to the radius of the plasma formation region 48. The top end magnet 90 the bottom end magnet 92 have opposite polarities. The first bottom magnet 86, the first top magnet 82 are polarized vertically and perpendicular to the radius of plasma formation regions 48.

FIG. 13 shows a vertical cross section of a useful embodiment of one of the plasma formation regions of the distributed multipolar ECR processing module also embodied in FIG. 11, and FIGS. 12(a) and (b). FIG. 13 shows another useful embodiment of the plasma formation region 48 which is a cross section of section J—J' of plasma formation region 48 as shown in FIG. 11. In this embodiment, the top magnet 82 and bottom magnet 88 are polarized substantially vertical and substantially perpendicular to radius of the plasma formation region 48. The first end magnet 90 and the second end magnet 92 have a polarity axis horizontal and parallel to a radius of the plasma formation chamber 48 and opposing polarities. The magnetic lines of flux are vertical and graded. The differences in the flux from the end to the interface with the main transfer chamber 34 is graded and again forms ECR only in one region and allows diffusion in the main transfer chamber 34.

Figure 14B:
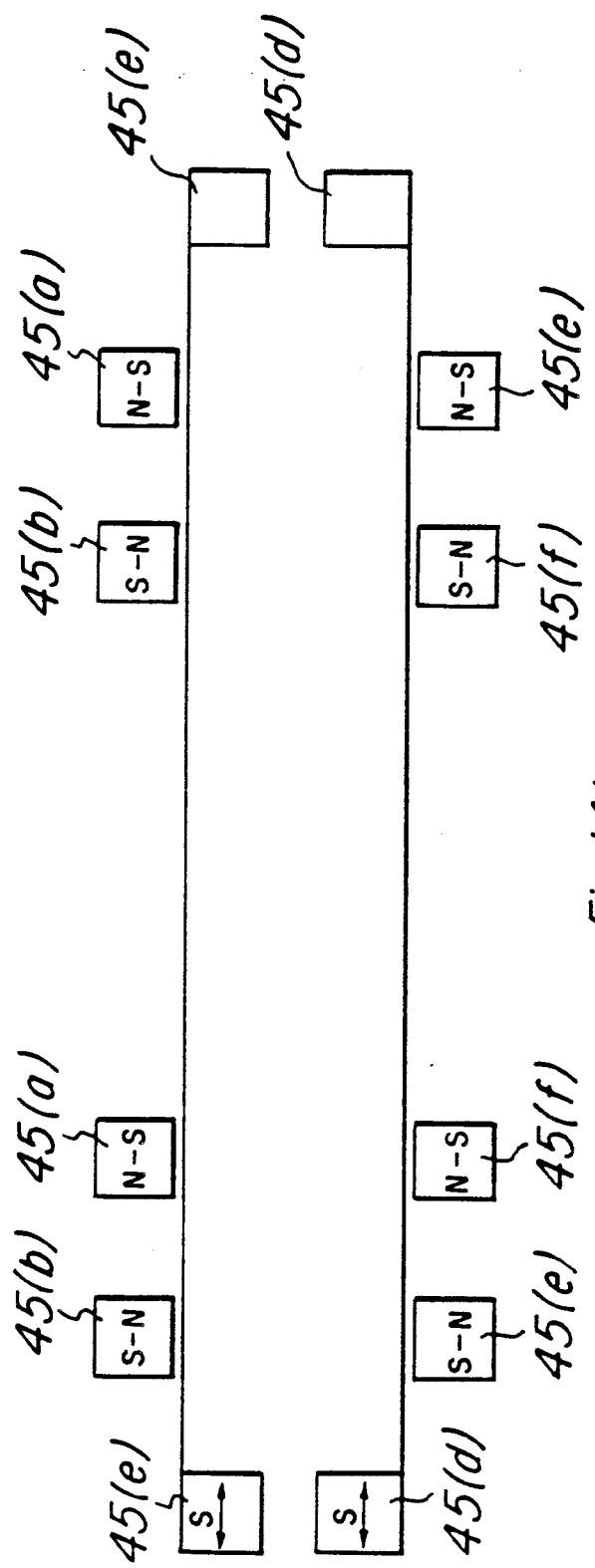
FIGS. 14(a) and (b) show a horizontal cross section of a useful embodiment of the plasma formation regions of the distributed multipolar ECR processing module also embodied in FIG. 11.

FIGS. 14(a) shows horizontal cross section A—A' of a useful embodiment of the plasma formation regions of the distributed multipolar ECR processing module also embodied in FIG. 11. This embodiment uses top ring magnets 45(a), 45(b) and sidewall magnets 45(c) and 45(d) with their polarities as shown in FIG. 14(a). FIG. 14(b) shows a vertical cross section K—K' of FIG. 14(a) which shows bottom ring magnets 45(e) and 45(f).

This processing module can be utilized in conjunction with advanced vacuum processing systems such as that disclosed in U.S. Pat. No. 4,685,999, issued Aug. 11, 1987 or any other single wafer processing module or modular processing system.

OPERATION

In operation, a wafer 14 is transferred into the processing chamber 12. Wafer 14 is then radiatively heated through window 22, if necessary, for the particular process by supplying electrical power to radiant heater 20. If a the embodiment in use has other multiple energy sources, such as the RF power source 32, an ultraviolet energy source or an excimer LASER, they can be activated, as desired. When the wafer 14 is at the appropriate temperature as determined, for example, by a non-contact, real time measurement through window 74, appropriate process gasses can be supplied to the plasma formation regions 48. The types of process gas or gasses depend on the type of processing to be performed. A variety of process gasses can be admitted to each of the plasma formation regions 48 via gas injectors 50, if desired, for plasma generation as indicated below. In addition, if desired, additional process gasses can be admitted to the vicinity of the face to be processed 16 via non-plasma gas injectors 96. After the process gas flows have been initiated, microwave power is supplied to antennae 52 through conductors 54, as desired, to generate a plasma in the plasma formation regions 48. As described above, the combination of the microwave power and magnetic flux leads to the generation of electron cyclotron resonance. The plasma products then flow by diffusion from the plasma formation regions 48 into the main transfer chamber 34 while being conducted away from t the walls of the plasma formation chamber 48 by the arrangement of permanent magnets as described above. After passing through the suppression grid 66 and into the main transfer chamber 34, the ECR plasma products are conducted away from the inner wall 36 of the main transfer chamber 34 by the action of the permanent magnets as described above.

After the desired process is complete the microwave power source and other power sources can be shut off. The processing chamber 12 can be purged using either the gas injectors 50, the non-plasma gas injectors 96, or purge ports 76. Multiple, sequential processing steps can be performed by varying the combination of the power sources and the process gasses. When all of the desired processing is complete, the wafer 14 is transferred from the processing chamber 12, to e.g. a load lock and patentailly so.

EXEMPLARY PROCESSES

The processing module 10 can perform different, as well as multiple sequential processes. Processing module 10 is capable of performing, for example, low temperature chemical vapor deposition, low temperature epitaxial growth, surface cleaning, and anisotropic etching.

A typical low temperature chemical vapor deposition process could be the deposition of silicon nitride on mercury cadmium telluride. Nitrogen is passes through the activated in the plasma formation chamber 48 using 50 watts of microwave power and flows through the main transfer chamber 34 to the process chamber 12 where silane is then added to the process chamber through the non plasma gas injectors 96. The result is silicon nitride thin film with no substrate heating required.

A low temperature epitaxial layer could be grown using argon passed through plasma formation chamber 48 along with silane and hydrogen being pased through the non plasma gas injectors 96. The pressure in the chamber could be $1 \times 10^{-3}$ at 750° C.

Several surface cleanup processes are possible using porcessing module 10. A clean up of organics and hydrocarbons can be accomplished by passing oxygen through the plasma formation chamber 48. A clean up of any native oxide or oxide grown during the first clean up step can then be performed in the same chamber as the first clean up step by passing hydrogen through plasma formation chamber 48. Finally, a clean up of mettalic contaminants can be performed by passing argon through the plasma formation chamber 48 and adding either hydrochloric or hydrofluoric gas to the process chamber 12 through the non plasma gas injectors 96.

Another typical low temperature chemical vapor deposition process is oxide planarization technology for deposition of a planarized oxide layer on a surface having an uneven surface, e.g. hills and valleys. In this process, oxygen and argon are activated in plasma formation chambers 48. Silane is added through the non plasma gas injectors 96 to the process chamber 12. A large RF signal is applied to the substrate for a short planarization time which effects the actual planarization.

One possible anisotropic etch process could be the etching of silicon dioxide with selectivity to silicon. This is accomplished by passing $C_3F_8$ gas through the plasma formation chambers 48 and using 60 watts of microwave power as well as 200 volts peak to peak RF at 800 kHz and $5 \times 10^{-4}$ Torr.

Another possible anisotropic etch process could be the etching of silicon. This is accomplished by passing $SF_6$ and argon gas through the plasma formation chambers 48 and using 600 watts of microwave power as well as 100 volts peak to peak RF at 13.56 MHz and $3 \times 10^{10-4}$ Torr.

Unless specifically stated otherwise above the power and frequencies used for RF and W plasma and ultraviolet light can be widely varied, as can the other process parameters.

The products of the processing the wafer 14 can be electronic devices, for example, integrated circuits or discrete semiconductor devices. Once the processing is completed the wafers are divided into devices. The circuits and devices are enclosed into packages, for example, as shown in U.S. Pat. Nos. 4,465,817 issued to Orcutt et al on Aug. 14, 1974 and 3,439,238 issued to Birchler et al on Apr. 15, 1969, which are incorporated hereinto by reference. These packages are then utilized in the construction of printed circuit boards. The printer circuits boards, which cannot operate without the packaged integrated circuits and devices to perform their intended functions, are the required electrical components within computers, photocopiers, printers, telecommunication equipment, calculators, and all of the other electronic equipment which are an essential ingredients of the electronic and information age. Thus electronic equipment cannot function with the circuits and devices.

Although the invention has been described and illustrated with a certain degree of particularity, it is understood that the present disclosure has been made by way of example only and that numerous changes in the combination and arrangement of parts may be resorted to without departing from the spirit and scope of the invention as hereinafter claimed.

What is claimed is:

1. A distributed electron cyclotron resonance remote plasma processing apparatus, comprising:
   (a) a processing chamber;
   (b) a main transfer chamber in fluid communication with the processing chamber;
   (c) a plurality of peripheral magnet bars substantially surrounding the main transfer chamber;
   (d) a plurality of electron cyclotron resonance plasma formation regions peripherally distributed around the periphery of, remote from, and in fluid communication with the main transfer chamber; and
   (e) a plurality of magnet bars substantially surrounding external surfaces of said plasma formation regions.

2. The apparatus of claim 1 wherein the magnetic bars are permanent magnets.

3. The apparatus of claim 2 wherein the permanent magnets are ceramic.

4. The apparatus of claim 2 wherein the plurality of magnetic bars are arranged so that electron cyclotron resonance can be established at some point in the plasma formation region.

5. The apparatus of claim 2 wherein the plurality of peripheral magnetic bars are arranged so that magnetic cusps are formed on the internal surface of the main transfer chamber.

6. The apparatus of claim 5 wherein the plurality of peripheral magnetic bars are arranged with the axis of the polarity of their magnetic fields perpendicular to a radius of the main transfer chamber.

7. The apparatus of claim 5 wherein the plurality of peripheral magnetic bars are arranged with the axis of the polarity of their magnetic fields are along a radius of the main transfer chamber.

8. The apparatus of claim 2 wherein the plurality of magnetic bars are arranged so that magnetic cusps are formed on the internal surface of the plasma formation region.

9. The apparatus of claim 1 further including a plurality of antennae.

10. The apparatus of claim 1 further including a non-plasma gas injector.

11. The apparatus of claim 1, further including a plurality of energy sources coupled into the process chamber.

12. The apparatus of claim 11 wherein one of the plurality of energy sources coupled into the process chamber is taken from the group consisting of an ultraviolet, RF, laser, and heat energy source.

13. The apparatus of claim 11 wherein the heat energy source is radiative.

14. The apparatus of claim 11 wherein the heat energy source is conductive.

15. The apparatus of claim 9 further including a plurality of antennae encapsulated in sapphire.

16. The apparatus of claim 15 further including a gas injector in the vicinity of each antenna.

17. The apparatus of claim 15 further including gas injectors in the vicinity of each of the antennae.

18. A distributed electron cyclotron resonance remote plasma processing apparatus, comprising:
   (a) a processing chamber;
   (b) a main transfer chamber in fluid communication with the processing chamber;
   (c) a plurality peripheral magnet bars surrounding the main transfer chamber;
   (d) a toroidal plasma formation region of trapezoidal cross section around the periphery of, remote from, and in fluid communication with the main transfer chamber;
   (e) a plurality of magnet bars substantially surrounding external surfaces of the plasma formation region; and
   (f) a plurality of plasma generators peripherally distributed in the plasma formation region.

19. The apparatus of claim 1 wherein the chamber is fabricated from aluminum.

20. The apparatus of claim 1 wherein the chamber is fabricated from aluminum the inner suface of which is hard anodized.

21. The apparatus of claim 1 wherein the chamber is fabricated from a material whose inner surface has been properly passivated.

22. The apparatus of claim 1 wherein the chamber is circular in shape.

23. The apparatus of claim 1 wherein a face of the wafer to be processed faces downward.

24. The apparatus of claim 1 wherein a radius of the wafer faces downward.

25. The apparatus of claim 18 wherein the magnetic bars are permanent magnets.

26. The apparatus of claim 25 wherein permanent magnets are ceramic.

27. The apparatus of claim 25 wherein the plurality of peripheral magnetic bars are arranged so that magnetic cusps are formed on the internal surface of the main transfer chamber.

28. The apparatus of claim 27 wherein the plurality of magnetic bars are arranged so that electron cyclotron resonance can be established at some point in the plasma formation region.

29. The apparatus of claim 27 wherein the plurality of peripheral magnetic bars are arranged with the axis of the polarity of their magnetic fields perpendicular to a radius of the main transfer chamber.

30. The apparatus of claim 27 wherein the plurality of peripheral magnetic bars are arranged with the axis of the polarity of their magnetic fields are along a radius of the main transfer chamber.

31. The apparatus of claim 27 wherein the plurality of magnetic bars are arranged so that magnetic cusps are formed on the internal surface of the plasma formation region.

32. The apparatus of claim 18 further including a non-plasma gas injector.

33. The apparatus of claim 18, further including a plurality of energy sources coupled into the process chamber.

34. The apparatus of claim 33 wherein the heat energy source is conductive.

35. The apparatus of claim 33 wherein one of the plurality of energy sources coupled into the process chamber is taken from the group consisting of an ultraviolet, RF, laser, and heat energy source.

36. The apparatus of claim 33 wherein the heat energy source is radiative.

37. The apparatus of claim 18 wherein the toroidal plasma formation chamber has a trapezoidal cross section.

38. The apparatus of claim 37 wherein the toroidal plasma formation chamber has a rectangular cross section.

39. The apparatus of claim 37 wherein the trapezoidal cross section is wider at an opening into the main transfer chamber than it is at an outer end of the plasma formation region.

40. The apparatus of claim 18 wherein the plasma generator includes a plurality of microwave antennae.

41. The apparatus of claim 40 further including a plurality of microwave antennae encapsulated in sapphire.

42. The apparatus of claim 40 further including a gas injector in the vicinity of each antenna.

43. The apparatus of claim 18 wherein a radius of the wafer faces downward.

44. The apparatus of claim 18 wherein the chamber is fabricated from aluminum.

45. The apparatus of claim 18 wherein the chamber is fabricated from aluminum the inner suface of which is hard anodized.

46. The apparatus of claim 18 wherein the chamber is fabricated from a material whose inner surface has been properly passivated.

47. The apparatus of claim 18 wherein the chamber is circular in shape.

48. The apparatus of claim 18 wherein a face of the wafer to be processed faces downward.

49. A distributed electron cyclotron resonance remote plasma processing apparatus, comprising:
(a) a processing chamber;
(b) a main transfer chamber in fluid communication with the processing chamber;
(c) a first plurality of permanent magnets surrounding the main transfer chamber;
(d) a plurality of plasma formation regions peripherally distributed around the main transfer chamber;
(e) a second plurality permanent magnets surrounding the external surfaces of the plasma formation regions;
(f) a plurality of peripherally distributed encapsulated antennae; and
(g) a plurality of gas injectors each positioned in the vicinity of one of the plurality of microwave antennae.

50. The apparatus of claim 49 wherein the plurality of peripheral magnetic bars are arranged with the axis of the polarity of their magnetic fields are along a radius of the main transfer chamber.

51. The apparatus of claim 49 further including a plurality of microwave antennae encapsulated in sapphire.

52. The apparatus of claim 49 further including a plurality of energy sources coupled into the process chamber.

53. The apparatus of claim 49 wherein the chamber is fabricated from aluminum.

54. The apparatus of claim 49 wherein the chamber is fabricated from aluminum the inner suface of which is hard anodized.

55. The apparatus of claim 49 wherein the chamber is fabricated from a material whose inner surface has been properly passivated.

56. The apparatus of claim 49 wherein the chamber is circular in shape.

57. The apparatus of claim 49 wherein a face of the wafer to be processed faces downward.

58. The apparatus of claim 49 a radius of a face of the wafer to be processed faces downward.

59. The apparatus of claim 49 wherein the plurality of peripheral magnetic bars are arranged with the axis of the polarity of their magnetic fields perpendicular to a radius of the main transfer chamber.

60. A method for manufacturing an integrated circuit device, comprising:
(a) generating electron cyclotron resonance activated species in plasma formation regions distributed peripherally, remote from and in fluid communication with a main transfer chamber;
(b) containing the activated species using a magnetic field in the plasma formation regions;
(c) introducing the activated species to the main transfer chamber;

(d) creating a magnetic mirror in the main transfer chamber using a magnetic field; and
(e) introducing the activated species to the process chamber and to a face of the workpiece.

61. The method of claim 60 wherein a face of the wafer to be processed faces downward.

62. The method of claim 60 wherein the activated species are generated using a microwave energy source.

63. The method of claim 60 wherein additional reactants are introduced to the process chamber.

64. The method of claim 60 wherein the additional reactants are activated by other energy sources coupled into the process chamber.

65. The method of claim 60 wherein the plasma stream and other non plasma reactants are activated in the main transfer chamber.

* * * * *